United States Patent [19]
James et al.

[11] Patent Number: 5,933,706
[45] Date of Patent: Aug. 3, 1999

[54] METHOD FOR SURFACE TREATMENT OF A CADMIUM ZINC TELLURIDE CRYSTAL

[76] Inventors: Ralph James, 5420 Lenore Ave., Livermore, Calif. 94550; Arnold Burger, 753 Adkisson La., Nashville, Tenn. 37205; Kuo-Tong Chen, 7800 River Fork Dr., Nashville, Tenn. 37221; Henry Chang, 6535 Premier Dr., Apt. A7, Nashville, Tenn. 37209

[21] Appl. No.: 08/864,133

[22] Filed: May 28, 1997

[51] Int. Cl.⁶ .................................................... H01L 21/00
[52] U.S. Cl. ............................................. 438/93; 438/475
[58] Field of Search ................................... 252/79.2, 79.4, 252/79.5; 438/745, 93; 427/399

[56] References Cited

U.S. PATENT DOCUMENTS

| | | | |
|---|---|---|---|
| 4,286,277 | 8/1981 | Longshore | 357/30 |
| 4,436,580 | 3/1984 | Boyd et al. | 156/636 |
| 4,861,421 | 8/1989 | Bienstock | 156/635 |
| 4,909,863 | 3/1990 | Birkmire et al. | 148/33.4 |
| 5,137,544 | 8/1992 | Medellin | 51/308 |
| 5,157,876 | 10/1992 | Medellin | 451/36 |
| 5,181,985 | 1/1993 | Lampert et al. | 156/635 |
| 5,279,974 | 1/1994 | Walsh | 437/3 |
| 5,457,330 | 10/1995 | Turner et al. | 257/188 |
| 5,528,495 | 6/1996 | Roscoe | 364/422 |
| 5,647,954 | 7/1997 | Matthews | 156/644.1 |
| 5,674,779 | 10/1997 | Tijburg et al. | 437/129 |

FOREIGN PATENT DOCUMENTS

WO9620412  12/1995  WIPO .

*Primary Examiner*—Bruce Breneman
*Assistant Examiner*—Alva C Powell
*Attorney, Agent, or Firm*—Timothy Evans; Kurt Olsen

[57] ABSTRACT

A method for treatment of the surface of a CdZnTe (CZT) crystal that reduces surface roughness (increases surface planarity) and provides an oxide coating to reduce surface leakage currents and thereby, improve resolution. A two step process is disclosed, etching the surface of a CZT crystal with a solution of lactic acid and bromine in ethylene glycol, following the conventional bromine/methanol etch treatment, and after attachment of electrical contacts, oxidizing the CZT crystal surface.

10 Claims, 2 Drawing Sheets

METHOD FOR SURFACE TREATMENT OF A CADMIUM ZINC TELLURIDE CRYSTAL

CROSS-REFERENCE TO RELATED APPLICATIONS

Not applicable.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention pertains generally to methods for improving the performance of detectors for gamma-ray and x-ray spectrometers and imaging systems, and particularly to a method for treating the surface of CdZnTe detector crystals to reduce leakage currents and increase spectral resolution.

Many of the commonly used radiation detectors employ Si(Li) or Ge semiconductor materials and thus operate most effectively at cryogenic temperatures and in a very clean vacuum. The need to operate Si(Li) or Ge-based detectors under these rigorous conditions poses significant limitations on the use of these materials in those applications where portability is desired. The general requirement for room temperature operation of a semiconducting material as a nuclear detector and spectrometer is a relatively large band gap energy such that thermal generation of charge carriers is kept to a minimum. Conversely, the requirement for high resolution is a small band gap energy such that a large number of electron-hole pairs is created for an absorbed quantum of ionizing radiation. The material under consideration should also have a relatively high average atomic number if used in gamma ray spectroscopy to increase the gamma ray interaction probability. High charge carrier mobilities and long charge carrier lifetimes are also needed to ensure efficient charge carrier extraction and minimal effects from position dependent charge collection.

CdZnTe (CZT), and particularly $Cd_{1-x}Zn_xTe$ (where x is less than or equal 0.5), is a wide bandgap ternary II–VI compound semiconductor that because of its unique electronic properties is desirable for use in gamma-ray and x-ray spectrometers that operate at room temperature for nuclear radiation detection, spectroscopy and medical imaging applications. However, the performance of gamma-ray and x-ray spectrometers fabricated from CZT crystals is often limited by surface leakage currents. Surface leakage currents act as a source of noise that reduces the ability of these spectrometers to spectrally resolve the unique radiological emissions from a wide variety of radioactive isotopes. Thus, in order to improve the spectral resolution capability of devices based on CZT crystals it is desirable to decrease surface leakage currents and the attendant detrimental noise effects.

It is known in the art that for a semiconductor crystal to function effectively as a good detector material (i.e., minimizing surface leakage currents, thereby maximizing energy resolution) the crystal surfaces must be properly treated. Generally, this means chemical etching of the surfaces to eliminate undesirable surface features. Currently the method for surface treatment of CZT crystals is to chemically etch the crystal surfaces in a solution of bromine dissolved in methanol to provide a planar surface prior to attachment of electrical contacts. These solutions are used because they reliably produce surfaces on CZT crystals that are substantially planar and have a low surface leakage current. However, there is a need to reduce the surface leakage current in CZT crystals even further in order to improve spectral resolution. What is required is a method for surface treatment of CZT crystal that will eliminate or reduce surface leakage currents to a level that is presently unattainable using prior art methods.

SUMMARY OF THE INVENTION

CdZnTe (CZT) crystals, particularly $Cd_{1-x}Zn_xTe$ (where x is less or equal 0.5) crystals and preferably $Cd_{0.9}Zn_{0.1}Te$ crystals, are useful for fabrication of small, portable, room temperature radiation detectors. The present invention provides a method for surface treatment of CZT crystals that reduces surface roughness (increases surface planarity) and provides a coating on the surface of the CZT crystal to reduce surface leakage currents to a previously unattainable level, thereby providing for improved energy resolution. A two step process is disclosed, wherein the surface of a CZT crystal is etched with a solution of lactic acid and bromine in ethylene glycol, following the traditional bromine/methanol etch treatment, and after attachment of electrical contacts the surface of the CZT crystal is oxidized, preferably by treatment with a solution of hydrogen peroxide.

BRIEF DESCRIPTION OF THE DRAWINGS

FIG. 2 shows low temperature (11K) photoluminescense spectra of etched $Cd_{0.9}Zn_{0.1}Te$ samples:

DETAILED DESCRIPTION OF THE INVENTION

Figure 1:
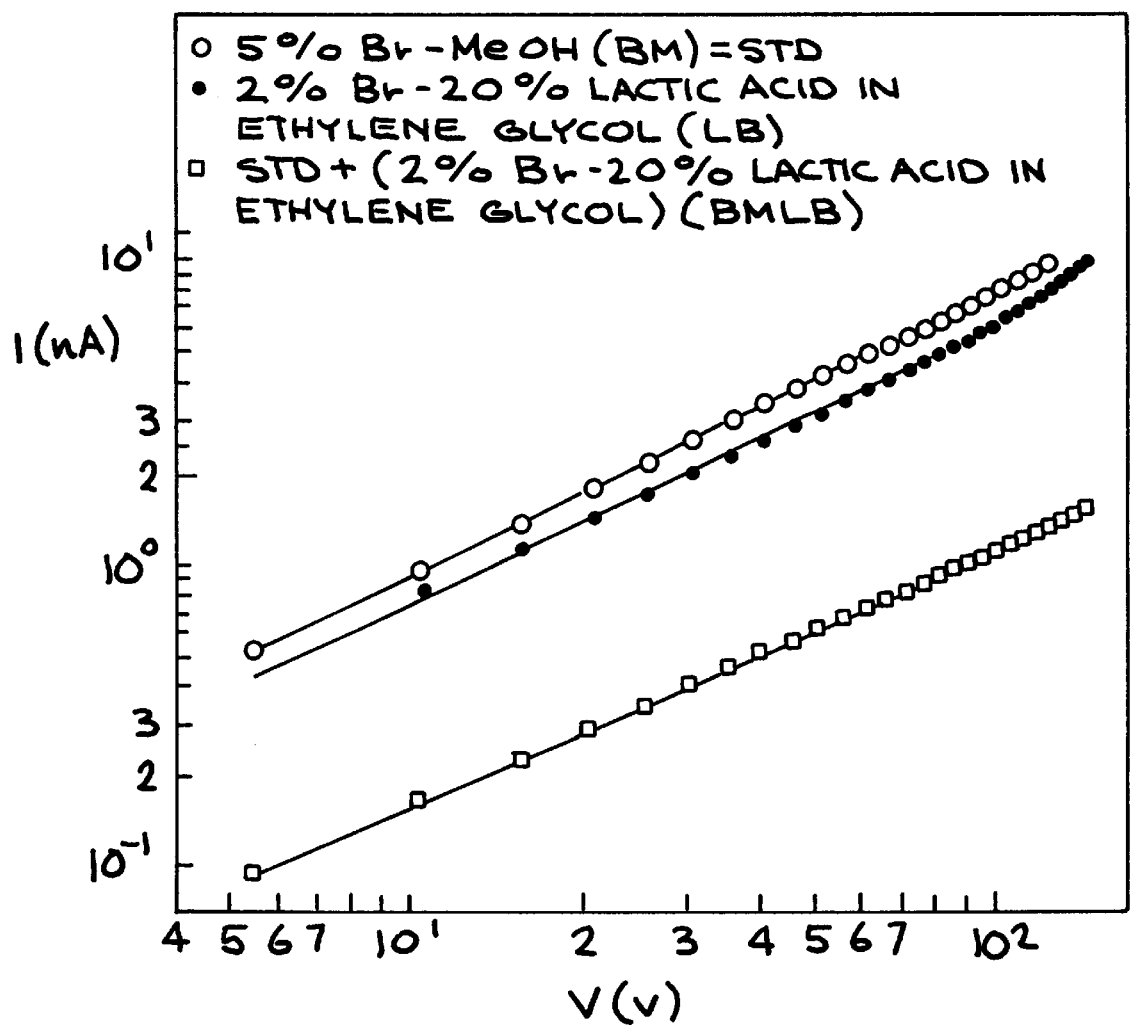
FIG. 1 shows current/voltage curves for CZT crystals having various surface treatments.

The present invention provides a novel and nonobvious method for producing a CZT crystal having a low value of leakage current unattainable with present surface treatment methods. The novel process disclosed herein comprises etching the surface of a CZT crystal, particularly a $Cd_{1-x}Zn_xTe$ (where x is less or equal 0.5) crystal, and preferably a $Cd_{0.9}Zn_{0.1}Te$ crystal, with a solution of lactic acid and bromine in ethylene glycol, following a conventional bromine/methanol etch, coupled with oxidizing the surface of the etched CZT crystal, following application of electrical contacts, preferably with a solution of hydrogen peroxide.

It is believed that surface leakage currents are dominated by two effects: 1) the presence of localized surface features having a high radius of curvature, such as sharp edges or corners and 2) the presence on the crystal surface of a thin layer of non-stoichiometric material having an electrical resistivity lower than the bulk crystal material.

It is well known that an electric field will be enhanced where surface features have a high radius of curvature. Since the leakage current is proportional to the localized electric field, those surface regions having a high radius of curvature will have a higher value of leakage current than surrounding areas of the crystal. Thus, it is desirable to remove these high radius of curvature surface features, thereby reducing the leakage current.

Chemical etchants do not act uniformly on all the components of materials such as CZT, generally leaving behind regions of nonstoichiometric material. In the case of a CZT crystal etched in a bromine/methanol solution, this nonstoichiometric material is believed to be a tellurium-rich surface layer having a conductivity that is substantially greater than the underlying stoichiometric CZT material. Since leakage current is proportional to electrical conductivity, it is further desirable to remove nonstoichiometric material from the crystal surface, thereby reducing the conductivity of the crystal surface layer.

The present invention solves these two problems by a novel process, including etching the surface of a CZT crystal to remove high radius of curvature features by an etchant comprising a mixture of bromine and lactic acid in ethylene glycol and preferably a mixture of 20 vol % lactic acid and 2 vol % bromine in ethylene glycol. While a broad range of etching times can be expected to produce surfaces having enhanced planarity as compared with the conventional bromine/methanol etching solutions, it is preferred that the step of etching last for about 2 minutes. Immediately following the etching process, electrical contacts are applied to the surface of the CZT crystal, particularly electroless gold and preferably gold electrodes deposited by thermally evaporation or sputtering. Subsequent to the step of applying electrical contacts, the surface of the CZT crystal having electrical contacts applied thereon, is oxidized to provide an oxide coating, preferably by immersing at least the CZT crystal surface in a hydrogen peroxide solution (15 vol % $H_2O_2$ in water) for about five (5) minutes. Other methods known to those skilled in the art to provide surface oxide coating can also be employed, such as immersing the CZT crystal in solutions of potassium hydroxide (KOH) or sodium hydroxide (NaOH) or anodizing the CZT crystal. Other art methods can include exposure of the CZT crystal to an oxygen plasma or beam or heating the CZT crystal in an oxygen containing atmosphere, preferably in air. Heating can be provided by furnaces, pulsed or continuous laser sources, lamps, or directed particle beams.

In order to better appreciate the advantages offered by the present invention, TABLE 1 compares the surface roughness of CZT crystals etched by various treatments as well as the results of gamma-ray spectral responses to a Ba-133 radioactive source. It should be noted that the percent full-width at half maximum (% FWHM) at 32 keV is a measure of the energy resolution; the smaller the number the higher the resolution. Ohmicity is a term of art referring to the ohmic quality of the contacts attached to the CZT surface; ideal ohmicity is 1.

TABLE 1

| Process | Surface Roughness (nanometers) | Ohmicity | % FWHM (at 32 keV) | Current Density at 625 V/cm (nA/cm$^2$) |
|---|---|---|---|---|
| A | 1.9 | 0.924 | 16.5 | 48.8 |
| B | 1.4 | 0.975 | 13.1 | 38.1 |
| C | 1.25 | 0.861 | 12.8 | 8.7 |

A—5 vol % Br in methanol for 2 minutes

B—20 vol % lactic acid+2 vol % Br in ethylene glycol for 2 minutes

C—5 vol % Br in methanol for 2 minutes+20 vol % lactic acid+2 vol % Br in ethylene glycol for 2 minutes.

It can be seen from TABLE 1 that not only does the step of etching described in the present invention provide a smoother surface on CZT crystals than the conventional bromine/methanol etch but also a comparison of the energy resolutions at 32 keV and leakage current densities (the smaller the leakage current the better the energy resolution) show that the step of etching provides a substantial improvement over the conventional method of etching CZT crystals.

FIG. 1 shows the current vs voltage curves for CZT crystals treated by (a) 5% Br in methanol for 2 minutes+20 vol % lactic acid+2 vol % Br in ethylene glycol for 2 minutes; (b) 20 vol % lactic acid+2 vol % Br in ethylene glycol for 2 minutes; and (c) 5% Br in methanol for 2 minutes and clearly demonstrates the advantage of the bromine/lactic acid etch provided by the present invention. These measurements where made by attaching Pt leads, having a diameter of about 0.01 mm, using Aquadag (graphite suspension in water) to Au contacts deposited onto the CZT surface by thermal evaporation, following the step of etching. The whole assembly was then covered with a protective coating, such as Humiseal supplied by Chase Corporation. The current-voltage measurements shown in FIG. 1 were made at room temperature using, by way of example, a Keithley Model 617 programmable electrometer in conjunction with a Bertan high voltage power supply.

Low temperature (11 K) photoluminescence spectra of $Cd_{0.9}Zn_{0.1}Te$ crystals were taken in order to compare the effect of surface treatment on radiative electron-hole recombination within the near-surface (<5 $\mu$m) region (FIG. 2). The spectra can basically be divided into three regions: Region I (1.64 eV–1.7 eV) is the exciton region; Region II (1.57 eV–1.64 eV) is the donor-acceptance pair (DAP) recombination region; and Region III (1.42 eV–1.57 eV) is the defect region associated with crystal imperfections and deeper impurity levels. The peaks in Region I have been identified as being due to excitons bound to neutral donors ($D^0$, X)—the main peak, excitons bound to neutral acceptors ($A^0$, X)—convoluted with the tail of the ($D^0$, X) peak, and free excitons in their ground state ($X_{n=1}$). In Region II the principal peak is due to donor-acceptor pair recombination (D, A). Other peaks are due to longitudinal optical phonon (LO) replica. In Region III the LO replica peaks are convoluted with other peaks in addition to the main deep-level defect peak (DEF) at 1.5616 eV.

Figure 2A:
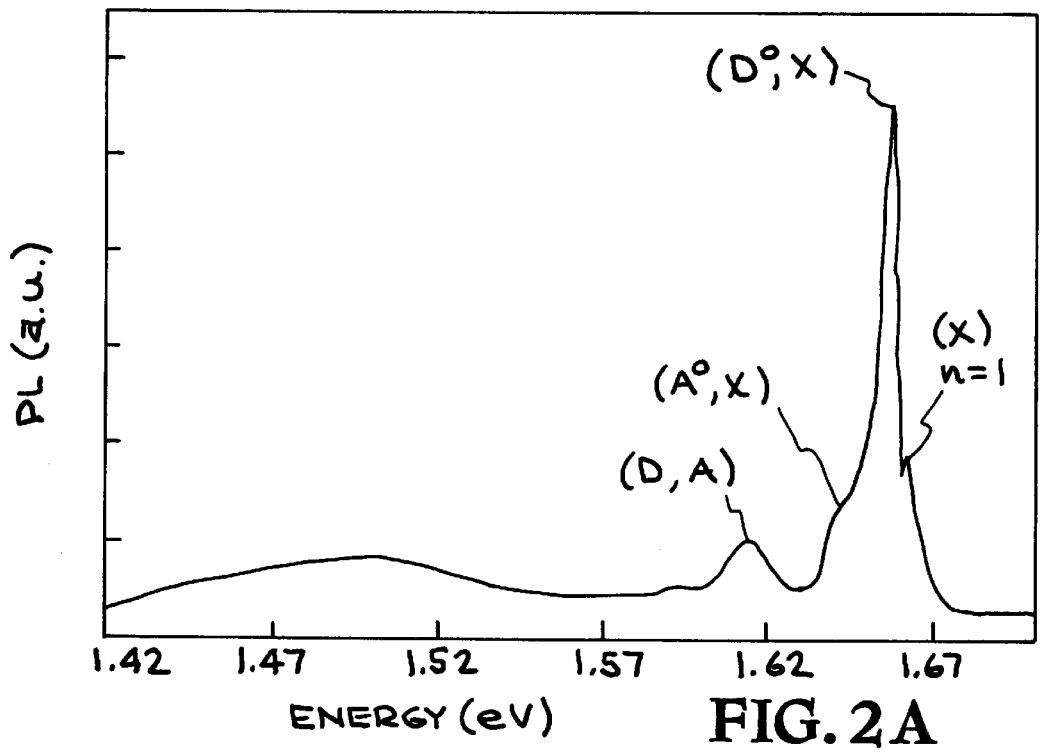
FIG. 2(a) surface etched with lactic acid and bromine in ethylene glycol.
Figure 2B:
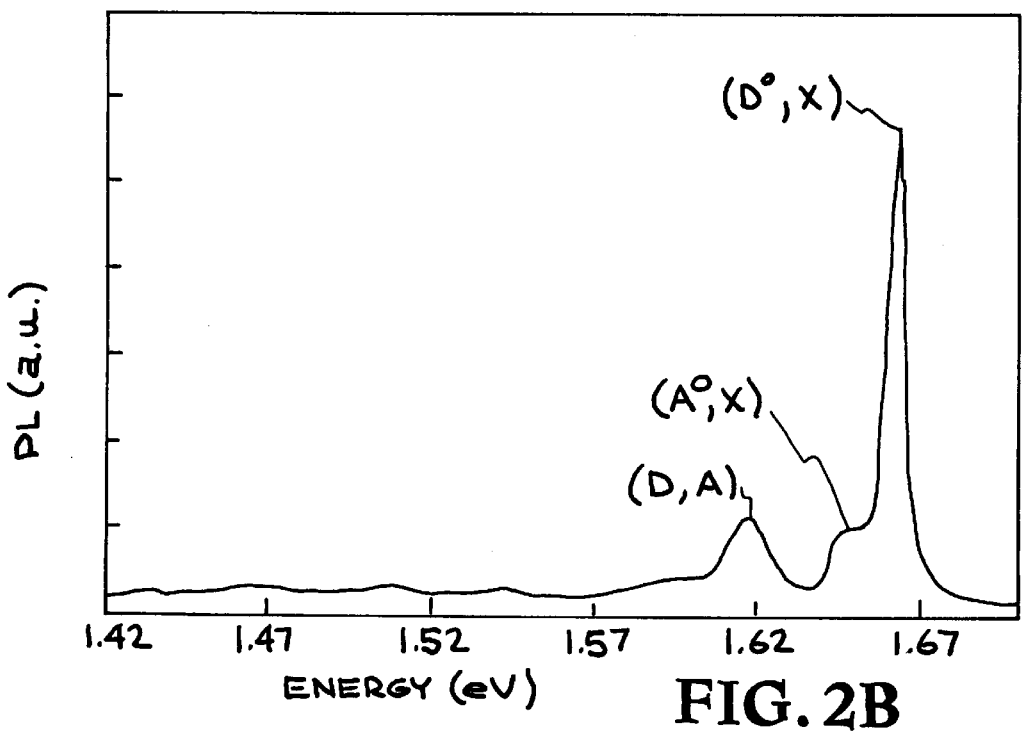
FIG. 2(b) surface etched with bromine in methanol.

FIG. 2 compares the low temperature photoluminescence spectra of a $Cd_{0.9}Zn_{0.1}Te$ crystal whose surface has been etched by the method described herein (FIG. 2a) to a $Cd_{0.9}Zn_{0.1}Te$ crystal whose surface has been etched by the conventional Br/methanol method (FIG. 2b). It can be seen in FIG. 2(a) that the $X_{n=1}$ peak at 1.6672 eV is clearly resolved from the main ($D^0$, X) peak centered around 1.6613 eV showing improved spectral resolution, indicative of a higher degree of surface crystallinity and stoichiometry. Further indicative of the higher degree of surface crystallinity and stoichiometry provided by the present method, is the ratio of peaks in various parts of the photoluminescence spectrum as set forth in TABLE 2 below; the higher the ratio the better the surface crystallinity and stoichiometry.

TABLE 2

| Process | I($D^0$, X)/I($A^0$, X) | I($D^0$, X)/I(D, A) | I($D^0$, X)/I(DEF) |
|---|---|---|---|
| A | 4.79 | 5.47 | 46.9 |
| C | 6.43 | 7.14 | 443.3 |

While the novel step of etching provided herein produces CZT detector crystals having lower leakage currents, the inventors have found that it is possible to further reduce the leakage current, and thus the noise level, and improve the sensitivity and spectral resolution of radiation detectors employing CZT crystals by oxidizing the surface of an etched CZT crystal particularly with a solution of hydrogen peroxide in water and preferably with a solution of 15 vol % hydrogen proxide in water subsequent to the steps of etching and applying electrodes to a CZT detector crystal. It is believed that the hydrogen peroxide oxidizes material on the surface of the CZT crystal to form an oxide layer which is about 20–50 nm thick and is comprised substantially of $TeO_2$.

Table 3 shows the effect on the leakage current of treating the surface of a CZT crystal with a solution of 15 vol % hydrogen peroxide in water for varying periods of time. It should be noted that the hydrogen peroxide treatment was preceded by etching the surface with a solution of 5% Br in methanol for about 2 minutes.

TABLE 3

| $H_2O_2$ Treatment Time (min) | Leakage current (nA/cm$^2$) |
|---|---|
| 0 | 511 |
| 5 | 328 |
| 10 | 324 |
| 15 | 344 |

It can be seen that treating the surface of a CZT crystal with a solution of 15 vol % hydrogen peroxide in water serves to reduce significantly the surface leakage current of the treated CZT crystal. Providing an oxide coating by oxidizing the surface of etched CZT crystals substantially reduces surface leakage currents by reducing the effect of high conductivity residues, such as Te, left on the etched surface at the completion of the etching process. This oxide coating allows for the difference in bias voltage between adjacent electrodes on strip or coplanar grid detectors to be increased without the onset of catastrophic noise effects, thereby increasing the sensitivity and energy resolution of the detector. It is preferred that the hydrogen peroxide solution treatment time be between about 4 and 10 minutes.

In summary, the present invention provides a novel method for reducing the leakage current of CZT crystals, particularly $Cd_{1-x}Zn_xTe$ crystals (where x is less or equal 0.5), and preferably $Cd_{0.9}Zn_{0.1}Te$ crystals, thereby enhancing their ability to spectrally resolve radiological emissions from a wide variety of radionuclides. The present method provides for etching the surface of a CZT crystal with a solution of bromine and lactic acid in ethylene glycol and subsequently oxidizing the crystal surface, preferably with a solution of hydrogen peroxide in water after electrodes have been attached to the crystal surface.

From the foregoing description, one skilled in the art can readily ascertain the essential characteristics of the present invention. The description is intended to be illustrative of the present invention and is not to be construed as a limitation or restriction thereon, the invention being delineated in the following claims.

SEQUENCE LISTING

Not Applicable.

We claim:

1. A method for reducing leakage current and improving spectral resolution in CdZnTe crystals, comprising the steps of:

a) etching a surface of a CdZnTe crystal with a first etching solution and a second etching, said first solution consisting essentially of bromine and methanol, said second solution comprising a mixture of bromine and lactic acids in ethylene glycol;

b) applying electrodes onto the etched surface of the CdZnTe crystal; and c) oxidizing the etched surface of the CdZnTe crystal.

2. The method of claim 1, wherein the solution of bromine and lactic acid in ethylene includes a solution of 20 vol % lactic acid and 2 vol % bromine in ethylene glycol.

3. The method of claim 1, wherein said step of oxidizing comprises immersing at least the etched surface of the CdZnTe crystal into a solution consisting essentially of hydrogen peroxide in water.

4. The method of claim 3, wherein the solution of hydrogen peroxide further comprises about 15 vol % hydrogen peroxide in water.

5. The method of claim 4, wherein the CdZnTe crystal is treated with the hydrogen peroxide solution for at least about 5 minutes.

6. The method of claim 1, wherein said first solution further includes a solution consisting essentially of about a 5 vol % solution of bromine in methanol.

7. The method of claim 1, wherein the step of applying comprises depositing electrodes by thermal evaporation.

8. The method of claim 7, wherein the electrodes are gold.

9. The method of claim 1, wherein the CdZnTe crystal has the composition $Cd_{1-x}Zn_xTe$, and wherein x is less than or equal 0.5.

10. The method of claim 9, wherein the CdZnTe crystal has the composition $Cd_{0.9}Zn_{0.1}Te$.

* * * * *